United States Patent [19]
Parker

[11] Patent Number: 5,973,958
[45] Date of Patent: Oct. 26, 1999

[54] INTERLACED STORAGE AND SENSE TECHNIQUE FOR FLASH MULTI-LEVEL DEVICES

[75] Inventor: Allan Parker, Austin, Tex.

[73] Assignee: Advanced Micro Devices, Inc., Sunnyvale, Calif.

[21] Appl. No.: 09/103,046

[22] Filed: Jun. 23, 1998

[51] Int. Cl.⁶ .................................................. G11C 16/04
[52] U.S. Cl. .............................. 365/185.03; 365/185.18; 365/184
[58] Field of Search .................. 365/185.03, 185.18, 365/184

[56] References Cited

U.S. PATENT DOCUMENTS

| | | | |
|---|---|---|---|
| 5,680,343 | 10/1997 | Kamaya | 365/184 |
| 5,721,701 | 2/1998 | Ikebe et al. | 365/185.18 |
| 5,815,436 | 9/1998 | Tanaka et al. | 365/185.03 |

*Primary Examiner*—Huan Hoang
*Attorney, Agent, or Firm*—Fliesler, Dubb, Meyer & Lovejoy

[57] ABSTRACT

An interlaced storage method for storing data in multi-level flash memory cells so that data bits from multiple addresses are encoded and stored in a single flash memory cell, and a method for reading and decoding the stored data. In the method for storing data, the data bit values for each address are multiplied by a weight having a greater value for each successively higher address to provide weighted bit values. The weighted bit values for the same order bits from the addresses are then added together to provide results, each result being programmed as a threshold voltage vt in a flash memory cell. To read the stored data, a weight comparison is set equal to the greatest weight and compared with the vt value in a first pass. If the vt value is equal to the weight comparison value, the data bits represented by the vt value are identified. If the vt value is greater than the weight comparison value, the most significant bit stored is identified as a "1" and the next lower weight is added to the weight comparison value for a second pass. If the vt value is less than the weight comparison value, the most significant bit stored is identified as a "0" and the next lower weight is subtracted from the weight comparison value for a second pass. Second and subsequent passes proceed in a similar manner with either all bits being identified, or only one bit identified and the weight comparison value being modified for a next pass. Passes proceed until all bits are identified.

13 Claims, 2 Drawing Sheets

INTERLACED STORAGE AND SENSE TECHNIQUE FOR FLASH MULTI-LEVEL DEVICES

BACKGROUND OF THE INVENTION

1. Field of the Invention

The present invention relates to a method for storing data in multi-level flash memory cells and a sensing method for reading the stored data.

2. Description of the Related Art

FIG. 1 shows a typical configuration for an integrated circuit including a flash memory array 100 and circuitry enabling programming, erasing, and reading for memory cells in the array 100. The flash memory array 100 is composed of individual cells, such as 102. Each cell has a drain connected to a bitline, such as 104, each bitline being connected to a bitline pull up circuit 106 and column decoder 108. Sources of the array cells are connected to Vss, while their gates are each connected by a wordline to a row decoder 110.

The row decoder 110 receives voltage signals from a power supply 112 and distributes the particular voltage signals to the wordlines as controlled by a row address received from a processor or state machine 114. Likewise, the bitline pull up circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines to sense amplifiers or comparators 116 as controlled by a column address signal received from processor 114. The sense amplifiers 116 further receive voltage reference signals from reference 118. The outputs from sense amplifiers 116 are then provided through data latches or buffers 120 to processor 114.

To program a cell in the flash memory array 100, high gate-to-drain voltage pulses are provided to the cell from power supply 112 while a source of the cell is grounded. For instance, during programming typical gate voltage pulses of 10V are each applied to a cell, while a drain voltage of the cell is set to 5.5V and its source is grounded. This programming procedure results in an increase of a threshold voltage for the cell, the threshold being the gate-to-source voltage required for the cell to conduct.

To erase a cell in the flash memory array 100, relatively high negative gate-to-source voltage pulses are applied. For instance, during erase gate voltage pulses of –10V are applied to a cell, while a drain of the cell is set to 5.5V and its source is floated. The large negative gate-to-source voltage pulses reduce the threshold of the cell.

To read the state of a cell, a typical control gate voltage of 5V is applied to the cell. The current output from the cell being read is received at an input of a number of the sense amplifiers 116 connected to the same bitline as the cell being read. A second input to each sense amplifier is provided from the reference 118. The reference 118 provides a different reference current to each sense amplifier connected to a bit line, with a current level set equal to current expected from a cell being read when programmed to a desired threshold voltage state. Binary outputs of the sense amplifiers 116 indicate if the cell being read is in a state which is greater than or less than the state of the reference signal received. Outputs of the sense amplifiers are provided through data latch/buffers 120 to the processor 114, enabling the processor 114 to determine from the sense amplifier outputs the threshold state of the cell being read.

Multi-level storage refers to the ability of a single memory cell to represent more than a single binary bit of data. A conventional memory cell depicts two states or levels, usually referred to as logic "0" and logic "1". A multi-level cell could represent as many as 256 states, or a byte of information.

Multi-level cell storage is obtainable in flash design because a flash memory cell can be programmed to provide multiple threshold voltage (vt) levels. The different vt levels can be sustained over time in a flash memory cell, even after repeated accesses to read data from the cell. For example, 16 vt levels stored in a flash memory cell can represent data in four conventional memory cells. Thus, an array of multi-level flash memory cells which can store up to 16 vt levels can provide 4 times the storage capacity of conventional memory cells which only store a binary bit per cell.

Table 1 below shows typical vt levels of a flash memory cell capable of storing up to 16 vt levels, along with a hexadecimal representation of the data stored. The hexadecimal number can be represented by 4 binary bits, or a nibble, as indicated by the data indication D(3:0) in Table 1.

TABLE 1

| Vt(V) | D(3:0) | Vt(V) | D(3:0) |
| --- | --- | --- | --- |
| 0 | 0 | 1.0 | 8 |
| 0.125 | 1 | 1.125 | 9 |
| 0.250 | 2 | 1.250 | A |
| 0.375 | 3 | 1.375 | B |
| 0.500 | 4 | 1.500 | C |
| 0.625 | 5 | 1.625 | D |
| 0.750 | 6 | 1.750 | E |
| 0.875 | 7 | 1.875 | F |

Table 2 below shows typical data stored in four addresses 100–103, the four address being shown in a first column of Table 2. With data in each address being represented by two 16 vt level flash memory cells, the data for each address is represented with two hexadecimal numbers, as shown in a second column of Table 2 beneath the indication D(7:0). The D(7:0) indication shows that 8 binary bits would be required to represent the data in each address. A third column beneath the heading D(7:4), and fourth column beneath the heading D(3:0) in Table 2 show an equivalent binary representation of data stored in the addresses 100–103.

TABLE 2

| Address | D(7:0) | D(7:4) | D(3:0) |
| --- | --- | --- | --- |
| 100 | AA | 1010 | 1010 |
| 101 | 55 | 0101 | 0101 |
| 102 | 84 | 1000 | 0100 |
| 103 | OF | 0000 | 1111 |

Table 3 below shows another representation of the data of Table 2, with eight 16 vt level flash memory cells, labeled B0–B7, represented for storing the data in a conventional fashion. In a first row of Table 3, the addresses 100–103 are shown, in a second row the multi-level flash memory cells B0–B7 used to store data for each of the addresses 100–103 are represented, and in a third row the hexadecimal representation for the data stored by each of the multi-level flash cells B0–B7 is shown.

TABLE 3

| Address | 100 | | 101 | | 102 | | 103 | |
|---|---|---|---|---|---|---|---|---|
| Physical cell | B0 | B1 | B2 | B3 | B4 | B5 | B6 | B7 |
| Stored Data(HEX) | A | A | 5 | 5 | 8 | 4 | 0 | F |

With conventional programming of multi-level flash memory cells to store data as illustrated in Table 3, to read the data stored at address 102 requires 2 bit lines, one for each flash memory cell B4 and B5, and 30 sense amplifiers. Each bit line is connected to an input of 15 sense amplifiers. Each sense amplifier for a bit line in turn has another input receiving a unique reference corresponding to threshold states between the 16 possible vt states for the flash memory cells. By monitoring the output of the sense amplifiers, the data stored by each flash memory cell can be determined.

The possibility to reduce the number of sense amplifiers exists, but is detrimental to the access time required to read data. For example, in the above case with 8 sense amplifiers per bit line, two sensing operation passes would be required to determine the state stored by a flash memory cell. Multiplexing to select proper references to each sense amplifier during each pass would also be needed. If 4 sense amplifiers are utilized, 4 passes would be required to identify the data stored in a multi-level memory cell.

SUMMARY OF THE INVENTION

The present invention provides a method for storing data in multi-level flash memory cells which minimizes the amount of circuitry required for reading data and also minimizes access times.

The present invention further provides a method for storing data bits from multiple addresses in a single flash memory cell, which will be referred to herein as interlaced storage.

The present invention further provides a storage technique for maximizing the number of bits stored per flash memory cell, but is flexible to allow other operation modes where various numbers of bits per cell can be stored in a cell as selected by a user.

The present invention includes a method for storing data beginning with the step of multiplying data bit values for each address in a select number of addresses by a weight having a greater value for each successively higher address to provide weighted bit values. The weighted bit values for the same order bits from the addresses are then added together to provide results, each result being programmed as a threshold voltage vt in a flash memory cell. The weights may be chosen so that the weight for the greatest address is ½ of the maximum storable threshold, vtmax, while weights for the remaining addresses are each ½ of the weight of a next successively higher address. Thus, the weight for the highest address is vtmax/2, the weight for the second highest address is vtmax/4, and so forth.

The present invention further includes a method for reading data stored according to the present invention. To read data, a weight comparison value equal to the greatest weight is compared with the vt value using one or more sense amplifiers in a first pass. If the vt value is equal to the weight comparison value, the binary data bits represented by the vt value are identified. If the vt value is greater than the weight comparison value, the most significant binary bit stored is identified as a "1" and the next lower weight is added to the weight comparison value for a second pass. If the vt value is less than the weight comparison value, the most significant bit stored is identified as a "0" and the next lower weight is subtracted from the weight comparison value for a second pass. Second and subsequent passes proceed in a similar manner with either all bits being identified, or only one bit being identified and the weight comparison value being modified for a next pass by adding or subtracting the next lower weight value. Passes proceed until all bits are identified.

During the reading procedure, outputs of sense amplifiers may be monitored during a first pass to provide comparison values for use in all subsequent passes. In another embodiment, references can be multiplexed to a more limited number of sense amplifiers and the sense amplifier outputs monitored during each pass to provide comparison values so that less total sense amplifiers are needed.

BRIEF DESCRIPTION OF THE DRAWINGS

Further details of the present invention are explained with the help of the attached drawings in which.

DETAILED DESCRIPTION

Figure 1:
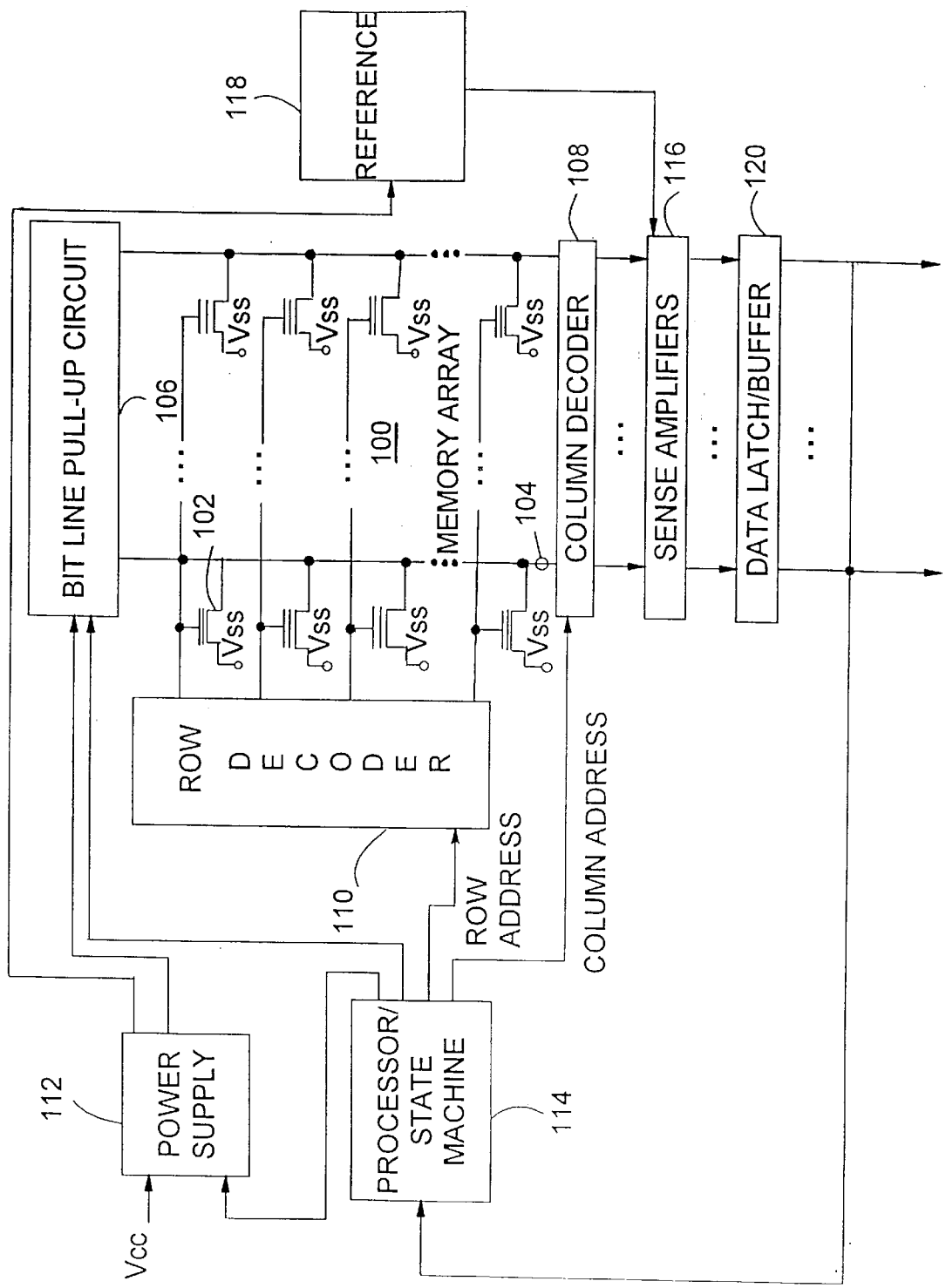
FIG. 1 shows a typical configuration for an integrated circuit including a flash memory array.

Unlike with conventional programming techniques, data for the present invention is not physically partitioned in storage by address boundaries. Instead, data from a number of addresses is combined and stored in a single flash memory cell. Data is combined and partitioned following a bit position order from a number of addresses. The number of addresses having bits stored in a single cell can be selected by a user to take advantage of the maximum storage capacity for a multi-level flash cell.

Table 4 below shows the data of Table 3 along with an additional row labeled Bit Wise Combo to illustrate how data from different addresses are combined according to the present invention to provide interlaced storage. In the additional row, the most significant bit of the byte of binary data for address 100 is combined with the most significant bit of the three addresses 101–103 to form a new data byte represented by a hexadecimal number 5. Similarly, the next highest order bit for the data for address 100 is combined with the next highest order bit for the addresses 101–103 to form a byte of data represented by the hexadecimal number 2. Data is similarly combined from lower order data bit positions of addresses 100–103 and represented with hexadecimal numbers in the additional row of Table 4.

TABLE 4

| | Interlaced Storage | | |
|---|---|---|---|
| Address | D(7:0) | D(7:4) | D(3:0) |
| 100 | AA | 1010 | 1010 |
| 101 | 55 | 0101 | 0101 |
| 102 | 84 | 1000 | 0100 |
| 103 | 0F | 0000 | 1111 |
| Bit Wise | Combo —> | 5212 | 9E9A |

Table 5 below shows how the data partitioned according to the present invention from Table 4 is stored in eight 16 vt level flash memory cells, labeled B0–B7. As shown, bit B0 stores the most significant hexadecimal number 5 representing the combination of the highest order data bits from the addresses 100–103 of Table 4. Bit B1 stores the next most significant hexadecimal number 2 representing the combination of the next highest order data bits from addresses 100–103. Additional flash memory cells B2–B7 store values representing the remaining bits combined from addresses 100–104.

TABLE 5

| Address | 103–100 | | 103–100 | | 103–100 | | 103–100 | |
|---|---|---|---|---|---|---|---|---|
| Physical cell | B0 | B1 | B2 | B3 | B4 | B5 | B6 | B7 |
| Interlaced Data (HEX) | 5 | 2 | 1 | 2 | 9 | E | 9 | A |

To store data in the flash memory cells, the present invention uses a novel encoding scheme. To determine the vt level to be stored, each binary bit from an address to be represented in a flash memory cell has a value multiplied by a weight having a greater value for each successively higher address to provide weighted bit values. The weighted bit values are then added together to determine a vt level to be stored.

In one embodiment, the weight for the highest address is ½ of the maximum threshold, vtmax, and the weight for the remaining addresses is ½ of the weight of the next successively higher address. Thus, the weight for the highest address is vtmax/2, the weight of the second highest address will then be vtmax/4, the third highest address will be vtmax/8, and so forth.

As an example, assuming a vtmax level of 2.0 volts, a vt level can be calculated for storing in the cell B0 of Table 5. The binary data represented by cell B0 is 0101, which in hexidecimal form is 5. Multiplying the binary bit values 0101 by the weight values vtmax/2=1, vtmax/4=0.5, vtmax/8=0.25, and vtmax/16=0.125 and adding the results vt is obtained as follows:

$$vt=(1\cdot 0)+(0.5\cdot 1)+(0.25\cdot 0)+(0.125\cdot 1)=0.625.$$

The vt value is programmed into a flash memory cell in an array configured as shown in FIG. 1. Programming is performed by the processor 114 having a memory with software stored to implement the storage method of the present invention. The processor 114 applies control signals to the power supply 112, row decoder 110 and bit line pull-up circuit 106 to enable the vt value to be programmed into a desired cell.

The present invention further provides a novel method for reading to decode the bits stored in a flash memory cell having a vt level programmed using the encoding scheme of the present invention. The method for reading can proceed with a number of passes during which sense amplifier readings are taken. The number of passes at a maximum will be equal to the total number of addresses having bits represented using a flash memory cell. The maximum number of passes will, thus, also be equal to the total number of weights used.

During a first pass, a sense amplifier having a reference corresponding to the greatest weight will be set as a designated sense amplifier. The designated sense amplifier output will be read to determine if the vt level for the cell being read is less than, greater than, or equal to the reference. Margin measurements between the designated sense amplifier and other sense amplifiers provided with next consecutive higher or lower references are used to determine if the cell has a vt equal to the reference of the designated sense amplifier.

If during the first pass the vt level is determined to be equal to the greatest weight, the highest order bit represented by the vt value can be identified as a binary 1, while the remaining bits can be identified as binary 0. If during the first pass the vt level is determined to be greater than the maximum weight, the highest order bit represented by the vt value is identified as a binary 1, and a value for the reference of the designated sense amplifier is added to the next lower weight to identify a reference for a new designated sense amplifier for a second pass. If during the first pass the vt level is determined to be less than the maximum weight, the highest order bit represented by the vt value is identified as a binary 0, and the next lower weight is subtracted from a value for the reference of the designated sense amplifier sense amplifier to identify a new designated sense amplifier for the second pass.

In the second pass and subsequent passes, the output of the designated sense amplifier will be read to determine if the vt level of the cell being read is less than, greater than, or equal to the reference of the designated sense amplifier. If during the second or subsequent passes the vt level is determined to be equal to the reference value, binary values for the vt value can be identified. If during the second or subsequent passes the vt level is determined to be greater than the maximum weight, the bit with an order corresponding to the current pass is identified as a binary 1, and a value for the reference of the designated sense amplifier is added to the next lower weight to identify a reference for a new designated sense amplifier for a subsequent pass. If during the second or subsequent pass the vt level is determined to be less than the maximum weight, the bit with an order corresponding to the current pass is identified as a binary 1, and the next lower weight is subtracted from a value for the reference of the designated sense amplifier to identify a new designated sense amplifier for a subsequent pass.

Operation proceeds with passes if all bits are not identified until a second most significant pass is reached. In the second most significant pass, the output of the designated sense amplifier will be read to determine if the vt level of the cell being read is less than, greater than, or equal to the reference for the designated sense amplifier. If the vt level is determined to be equal to the reference value, binary values for the vt value are identified. If the vt level is determined to be greater than the reference provided to the designated sense amplifier, the next lower weight is added to the value of the reference for the designated sense amplifier and the total is used to identify the binary values for vt. If during the second most significant pass the vt level is determined to be less than the reference for the designated sense amplifier, and the reference provided to the designated sense amplifier is greater than the second lowest weight, the next lower weight is subtracted from the value of the reference of the designated sense amplifier and the total is used to identify the binary values for vt.

If the vt level is less than the reference of the designated sense amplifier and the reference value is equal to the second lowest weight, the sense amplifier having a reference corresponding to the lowest weight is set as the designated sense amplifier. A last pass is then performed and the output of the designated sense amplifier read to determine if the vt level of the cell being read is equal to or less than the reference for the designated sense amplifier. In either case, binary values for the vt level can be identified.

As an example of reading, assume a cell has a vtmax level of 2.0 volts and the vt level is programmed to be 0.625 volts in the cell B0 as represented in table 5, as in the a previous example. As indicated previously, the binary data represented by cell B0 is 0101, and the weight values used to calculate the vt value are 1, 0.5, 0.25, and 0.125.

Figure 2:
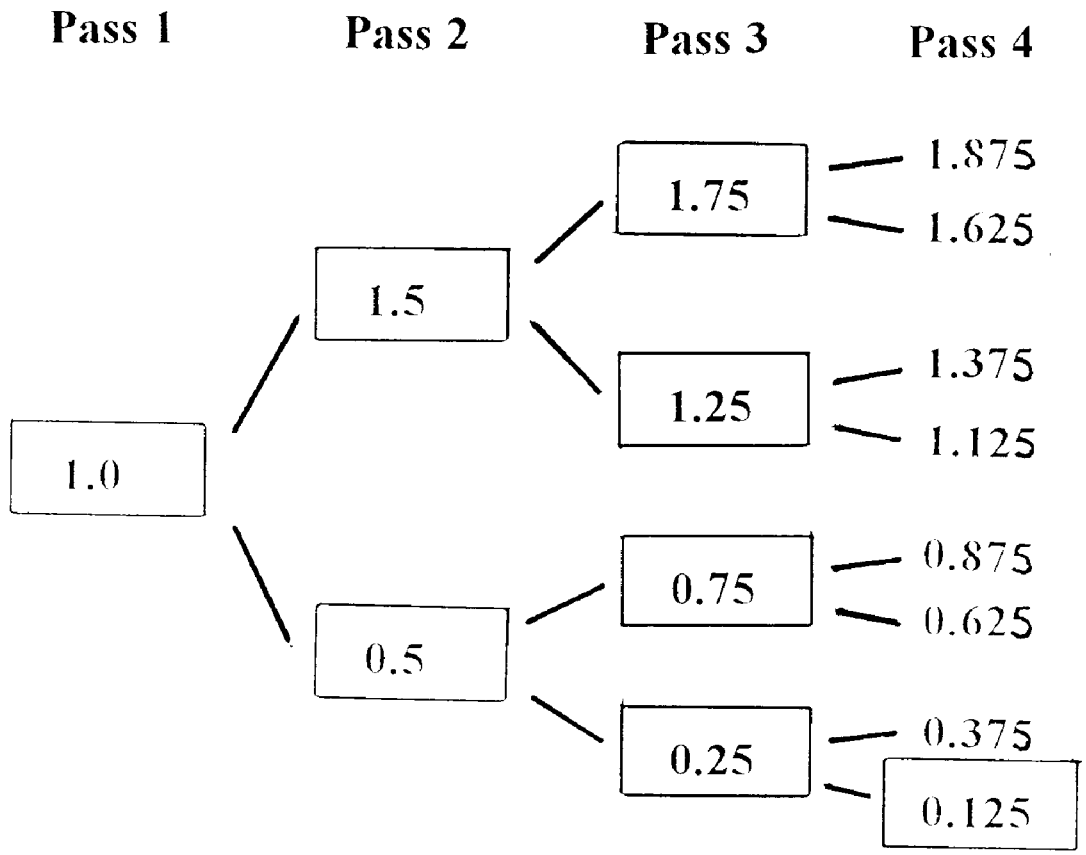
FIG. 2 illustrates comparison values potentially used during each pass when reading data from a multi-level flash cell using the method of the present invention.

During a first pass, the vt value will be compared with the highest weight value of 1.0V, as illustrated in FIG. 2. If the vt value was equal to the highest weight, the binary values represented by vt would be 1000. If the vt value were higher than 1.0, then the highest order bit would be defined as a binary "1" and the next lower weight of 0.5V would be added to the maximum weight of 1.0V to obtain a 1.5V comparison value for the second pass. However, in this case, the vt value is less than 1.0V, so the highest order bit is defined as a binary "0" and 0.5V is subtracted from 1.0V to obtain a 0.5V comparison value for the second pass.

In the second pass, the vt value is determined to be greater than the 0.5V comparison value, so the second highest bit is defined as a "1" and the next lower weight of 0.25V is added to the 0.5V comparison value to obtain a new comparison value of 0.75V for the third pass. In the third pass, the vt value is determined to be less than the 0.75V comparison value, so the third highest bit is defined as a "1", and the next lower weight of 0.125V is subtracted from the 0.75V comparison value to get the 0.625V value which identifies the fourth highest bit as a binary "0".

FIG. 2 shows a tree of possible comparison values which may be needed to decode the bits represented by the vt value of a memory cell where data from 4 different addresses are stored in a single multi-level cell. The values boxed represent values where sense amplifiers are needed during the reading process of the present invention. As shown, a maximum of 4 passes and 8 sense amplifiers are needed. Control multiplexers to selectively connect references during each pass may be utilized to further limit the number of sense amplifiers needed to a maximum of 4.

Although the method for reading as described uses 4 passes with results taken from sense amplifiers during each pass, reading can also be performed according to the present invention with all sense amplifier accesses being complete in a single pass. For instance, if the flash memory cell stores information for bits from 4 different addresses, a single pass can be used with 8 sense amplifiers connected to references such as the sense amplifier references circled in FIG. 2. The sense amplifier outputs can then saved to provide the same results which can be obtained using sensing during four separate passes as described above.

As with programming, reading is performed using the processor 114 as shown in FIG. 1 having a memory with software to implement the reading method of the present invention as described above. The processor 114 applies control signals to the power supply 112, row decoder 110, column decoder 108, and pull up circuit 106 to enable bit values represented by a vt value of a cell to be read from the output of the sense amplifiers 116. With a limited number of sense amplifiers 116 being desirable, a multiplexer can be provided between the references 118 and sense amplifiers 114 to select different references to the sense amplifiers during separate read passes as controlled by processor 114.

In summary, two important advantages are achieved by the present invention include a reduced access time and increased flexibility. Reduced access time is obtained because with only one address accessed, data from 3 additional addresses will be provided. Greater flexibility is provided because a software control signal can be used to enable storage of data bits from a desired number of addresses per flash memory cell.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method of storing data in flash memory cells, each data including binary bit values located by an address, the method comprising the steps of:

multiplying the bit values located by each one of the addresses by a weight having a greater value for each successively higher address to provide weighted bit values;

adding the weighted bit values for the same order bits from the addresses together to provide results;

programming threshold voltage values in the flash memory cells, each corresponding to one of the results.

2. The method of claim 1 further comprising the step of:

selecting a number of the addresses which have binary bit values which may be represented in a single one of the flash memory cells.

3. The method of claim 1, wherein a greatest one of the weights is ½ of a maximum programmable threshold level, and wherein each weight less than the greatest weight is ½ the weight of the next successively higher one of the weights.

4. The method of claim 1, wherein the data in each of the addresses include N of the binary bit values, where N is an integer, and wherein the step of adding the weighted bit values produces N results.

5. The method of claim 1, wherein a number of the addresses is four.

6. A method for reading a result stored in a given one of the flash memory cells according to the method of claim 1, the method of reading comprising the steps of:

(a) defining a current pass as identifying the greatest one of the weights;

(b) defining a weight comparison value as the greatest one of the weights;

(c) determining if the weight comparison value is equal to the threshold voltage value stored by the given memory cell and if so proceeding to step (i);

(d) redefining the current pass as identifying the next successively lower weight;

(e) determining if the threshold voltage value stored by the given memory cell is greater than the weight comparison value, and if so adding the weight identified by the current pass to the weight comparison value and proceeding to step (g);

(f) subtracting the weight identified by the current pass from the weight comparison value;

(g) determining if the current pass is identifying the lowest weight and if not proceeding to step (c);

(h) determining if the threshold voltage value stored by the given memory cell is less than the lowest weight value, and if so redefining the weight comparison value as having no weight; and (i) identifying bit values represented by the result stored in the given flash memory cell from the weight comparison value.

7. The method of claim 6, wherein a greatest one of the weights is ½ of a maximum programmable threshold level, and wherein each weight less than the greatest weight is ½ the weight of the next successively higher one of the weights.

8. An integrated circuit comprising:

an array of flash memory cells, each cell having a control gate connected to a wordline in a row of wordlines, and a drain connected to a bitline in a column of bitlines;

a power supply receiving a control signal, the power supply being coupled to the bitlines and the wordlines for providing a power supply signal to selectively program desired threshold voltage values in each of the flash memory cells as controlled by the control signal; and a processor coupled to the power supply for providing the control signal, and to a data and address bus, the processor being configured to perform the following steps:
  (a) receiving data located by addresses from the data and address bus, each data including binary bit values located by one of the addresses;
  (b) multiplying the bit values located by each one of the addresses by a weight having a greater value for each successively higher address to provide weighted bit values;
  (c) adding the weighted bit values for the same order bits from the addresses together to provide results;
  (d) providing the control signal to the power supply to cause threshold voltage values to be programmed into the flash memory cells, each threshold voltage value corresponding to one of the results.

9. The integrated circuit of claim 8, further comprising:

N sense amplifiers coupled to each bit line, each sense amplifier having a first input receiving a voltage value of one of the weight values, a second input coupled to one of the bit lines, and an output coupled to the processor, wherein the processor further provides the control signal to the power supply to enable the power supply to apply voltages to the bit lines and word lines to selectively enable one of the flash memory cells on each one of the bit lines to provide its stored threshold voltage value, the processor reading the binary bits represented by a threshold voltage value stored by a given one of the memory cells connected to a given bit line by performing the following steps:
  (a) defining a current pass as identifying the greatest one of the weights;
  (b) selecting a designated sense amplifier as a sense amplifier having a first input receiving the greatest one of the weights;
  (c) determining from the output of the designated sense amplifier if the threshold voltage value stored by the given memory cell is substantially equal to the voltage at the first input of the designated sense amplifier and if so identifying the binary bits represented by the threshold voltage value of the given memory cell from the voltage value at the first input of the designated sense amplifier;
  (d) redefining the current pass as identifying the next successively lower weight, and if the current pass is now identifying the second lowest weight, proceeding to step (g);
  (e) determining from the output of the designated sense amplifier if the threshold voltage value stored by the given memory cell is greater than the voltage at the first input of the designated sense amplifier, and if so adding the weight identified by the current pass to the voltage value at the first input of the designated sense amplifier to identify a first input of another one of the sense amplifiers now redefined as the designated sense amplifier and proceeding to step (c);
  (f) subtracting the weight identified by the current pass from the voltage value at the first input of the designated sense amplifier to identify a first input of another one of the sense amplifiers now redefined as the designated sense amplifier and proceeding to step (c);
  (g) determining from the output of the designated sense amplifier if the threshold voltage value stored by the given memory cell is greater than the voltage at the first input of the designated sense amplifier, and if so adding the weight identified by the current pass to the voltage value at the first input of the designated sense amplifier to identify a current weight value and proceeding to step (j);
  (h) determining if the first input of the designated sense amplifier is indicating the second lowest weight, and if so redefining the designated sense amplifier as the sense amplifier having a first input corresponding to the lowest weight and proceeding to step (i), and if not subtracting the weight identified by the current pass from the voltage value at the first input of the designated sense amplifier to identify a current weight value and proceeding to step (j);
  (i) determining from the output of the designated sense amplifier if the threshold voltage value stored by the given memory cell is equal to the voltage at the first input of the designated sense amplifier and if so reading the threshold voltage value stored by the given memory cell as the voltage value on the first input of the designated sense amplifier, and if identifying the current weight value as zero and proceeding to step (j);
  (j) identifying the binary bits represented by the threshold voltage value of the given memory cell from the current weight value.

10. The method of claim 9 wherein the processor is further connected to a user interface for receiving a bits per cell selection input, the bits per cell selection input enabling the processor to set a maximum number of the addresses which have binary bit values which may be represented in a single one of the flash memory cells.

11. The method of claim 9, wherein a number of the addresses is four.

12. The method of claim 11, wherein the number of sense amplifiers is eight.

13. The method of claim 9, wherein a greatest one of the weights is ½ of a maximum programmable threshold level, and wherein each weight less than the greatest weight is ½ the weight of the next successively higher one of the weights.

* * * * *